INVENTOR
JAGTAR S. BASI
BY [signature]
ATTORNEY

SOLUTION FLOW RATE = 50ml/MIN.
WAFER AREA = 4.7 INCHES$^2$ $Na_2CO_3$ CONCENTRATION = 0.8N

United States Patent Office 3,738,882
Patented June 12, 1973

3,738,882

METHOD FOR POLISHING SEMICONDUCTOR GALLIUM ARSENIDE PLANAR SURFACES

Jagtar Singh Basi, Wappingers Falls, N.Y., assignor to International Business Machines Corporation, Armonk, N.Y.

Filed Oct. 14, 1971, Ser. No. 189,114
Int. Cl. H01l 7/00
U.S. Cl. 156—17 6 Claims

ABSTRACT OF THE DISCLOSURE

An improved method for polishing gallium arsenide planar surfaces is disclosed comprising positioning gallium arsenide wafers or slices in close adjacency to a polishing medium providing a relative motion between said wafer and polishing medium while providing a controlled predetermined flow of alkali metal hypochlorite and alkali carbonate solution to said wafers and polishing medium and continuing the relative motion until the wafer surface is polished to a smooth and featureless condition whereupon the wafers are washed and removed from the polishing mechanism.

BACKGROUND OF THE INVENTION

Field of the invention

This invention relates to a method for polishing semiconductor planar substrates to a high degree of surface perfection and more particularly to a method for polishing gallium arsenide wafers or slices under predetermined conditions whereby a greatly improved polishing rate is obtained and surface conditions are of an improved high degree of perfection.

Description of the prior art

Semiconductor devices such as integrated monolithic circuits, diodes, passive devices, and the like, are formed by various additive techniques, such as diffusion and epitaxial growth in the planar surfaces of semiconductor materials. Gallium arsenide is a well known material utilized for the manufacture of such devices. The perfection of the gallium arsenide planar surface in regard to featureless or surface fine-structure conditions down to an order of angstrom units, surplus planarity, uniformity and freedom of mechanical damage and flatness is a fundamental requirement for the manufacture of semiconductor devices. It is advantageous and desirable to have gallium arsenide wafers or slices having highly polished surfaces prior to the performance of processing steps where effectiveness may be decreased by the presence of undesirable surface conditions and contaminants. Such processing steps might include, for example, the formation of epitaxial layers on the slice, the controlled diffusion of impurities into the slice or thermal treatment or final encapsulation of the device. The surface planarity of the wafer becomes highly critical in photolithographic masking techniques because of the constant effort to decrease the physical device. Any increase in distance between the mask and the wafer surface caused by significant deviations from the ideally planar wafer unfavorably effects the image resolution of fine device structure on the surface of the wafer. Poor device yields are the result at the periphery of the wafer where a nonplanary becomes more pronounced as one proceeds towards the edge or outside periphery of the wafer for device formation. The surface fine-structure characteristic over the entire wafer is also an extremely important characteristic as it can produce poor devices throughout the wafer. Mechanical or physical defects and irregularities in the planar wafer surface also produce marginal or useless devices throughout the entire surface which also can result in a waste of manufacturing time and excess cost due to low yield.

There are a wide variety of chemical agents known which will dissolve gallium arsenide. Consequently, the agents will etch the material. The majority of these etchants are preferential or selective. This means the surface of a given crystallographic orientation of single crystal gallium arsenide etches at different rates along the different crystallographic planes intersecting this surface. Such etchants are termed selective etchants because of the nature of their etching behavior. Therefore, one cannot employ them to obtain mirror-smooth or featureless planar surfaces without disregard for crystallographic orientation. U.S. Pat. No. 3,342,652 discloses the use of sodium hypochlorite and potassium hypochlorite solutions useful as oxidizing agents in the polishing of gallium arsenide. This teaching only discloses the use of very dilute solutions of sodium and potassium hypochlorite, which are useful for polishing gallium arsenide, and illustrates that higher concentrations are deleterious in that they produce oxidized and pitted surfaces upon the wafer or slice.

The chemical etchants suitable for producing polished surfaces on semiconductor materials such as silicon and germanium are not very effective in polishing the III–V compound semiconductors. Mixtures of hydrogen fluoride and nitric acid in various proportions and concentrations can be used to some extent. However, poor surface conditions generally result when gallium arsenide surfaces are being polished with nitric acid even at the smoother etching <100> face. The use of bromine in methyl alcohol has been suggested as a polishing or etching solution in a wide variety of concentrations. The use of bromine and chlorine with organic solvents requires considerable caution since violent reactions may occur. Similarly, hydrogen peroxide in combination with sulphuric acid, sodium hydroxide or ammonium hydroxide may be used as a polishing medium but under limited conditions and at low polishing rates. Aqueous silica gel has some use at low rates but produces imperfect surfaces.

Prior art techniques for the polishing of gallium arsenide wafer surfaces may be evaluated in reaction to the rate of material removed over a specified time at maximum load conditions. Gallium arsenide surfaces polished are in a multi-wafer configuration or a single wafer. The prior art also states that polishing is undertaken subsequent to a lapping step utilizing aluminum oxide diamond and other suitable lapping grit. The wafers or slices are polished at a rate of .7 to 2 mils per hour material removal.

SUMMARY OF THE INVENTION

It is an object of this invention to provide a method for polishing gallium arsenide surfaces to a high degree of perfection.

It is a further object of this invention to provide a method for polishing gallium arsenide surfaces at a rate heretofore unknown.

It is a further object of this invention to provide a method or process for obtaining any high quality damage-free planar polishes on all gallium arsenide crystallographic orientations.

It is another object of this invention to provide a method for polishing doped monocrystalline gallium arsenide.

It is another object of this invention to provide a process which enables polishing of all common gallium arsenide crystallographic orientations independent of conductivity type to produce a highly polished featureless planar surface.

It is still a further object of this invention to provide a chemical method of polishing gallium arsenide wafers or slices which produces a highly planar and excellent featureless surface.

These and other objects are accomplished in accordance with the broad aspects of the present invention by providing a method or process comprising positioning an area of gallium arsenide surfaces in a single or multiwafer configuration upon a suitable polishing block or wheel adjacent to a polishing medium while maintaining a constant flow of sodium hypochlorite and sodium carbonate solution upon said medium and gallium arsenide surfaces and simultaneously providing a relative motion between said surface and polishing medium for a predetermined time dependent upon said solution concentrations and flow rates of said solution upon the polishing medium and gallium arsenide surface. The foregoing steps are followed by washing and removing the wafer or slices from the polishing mechanism.

The foregoing and other objects, features and advantages of this invention will be apparent from the more particular description of the preferred embodiments of the invention as illustrated in the accompanying drawings.

DESCRIPTION OF PREFERRED EMBODIMENTS

The gallium arsenide polishing method of this invention avoids the shortcomings of prior techniques which utilized dilute solutions of sodium hypochlorite (1.25 to 2.4 grams per litre). It has been reported that higher concentrations of sodium hypochlorite produce pitted surfaces and the polishing rate even utilizing dilute solutions is only in the magnitude of 0.7 to 2 mils per hour.

It is believed the method of this invention proceeds in accordance with the following chemical reaction:

$$GaAs+4NaOCl \rightarrow GaAsO_4+4NaCl$$

The gallium arsenate formed in accordance with the foregoing reaction is believed to dissolve in sodium carbonate to form sodium gallate ($NaGa(OH)_4$), sodium arsenate and sodium bicarbonate.

Appropriate solution concentrations of sodium hypochlorite and sodium carbonate are separately prepared at room temperature and mixed for utilization in conjunction with polishing mechanisms. Mixing separately prepared solutions avoids the occurrence of the heat of solution when solid sodium carbonate is added to a solution of sodium hypochlorite. The heat of solution tends to decompose the sodium hypochlorite and thereby reducing its concentration.

Any standard polishing equipment is appropriate for use in this method. The wafer plate polishing assembly described in U.S. Pat. No. 3,342,652 is an example of polishing apparatus suitable for use in accordance with the method of this invention. Generally, a lapping or rough polishing step is followed, but due primarily to the great increase in polishing rates made possible by this invention, lapping is not necessary to produce bright, featureless gallium arsenide surfaces.

Figure 1:
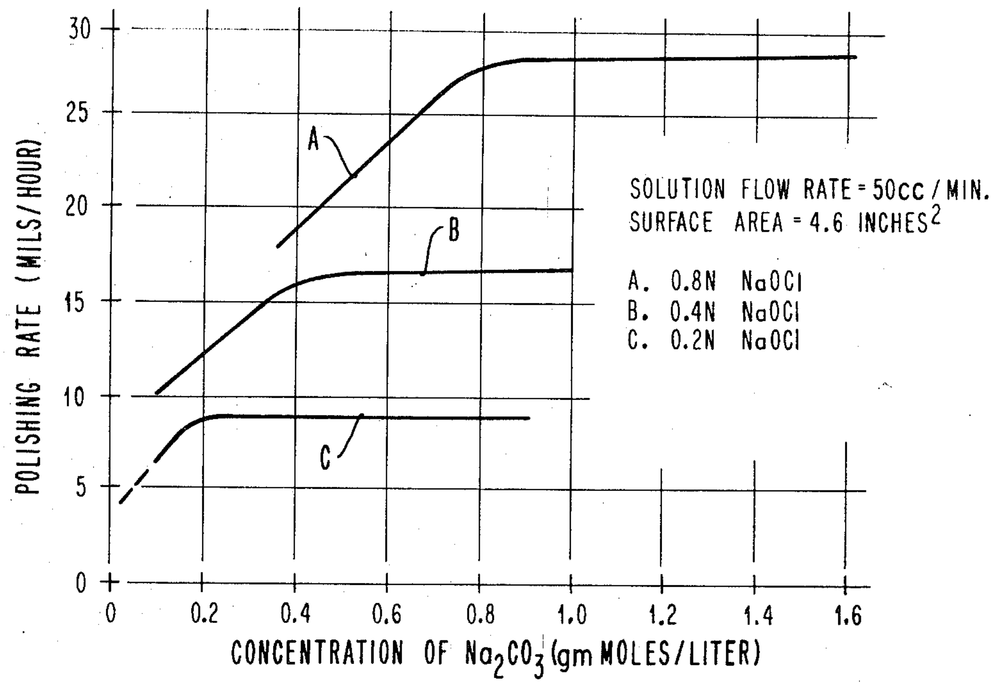
FIG. 1 is a plot of the polishing rate of chromium doped gallium in mils per hour versus the concentration normality of sodium carbonate in the polishing solution and showing the profile for various sodium hypochlorite concentrations.
Figure 2:
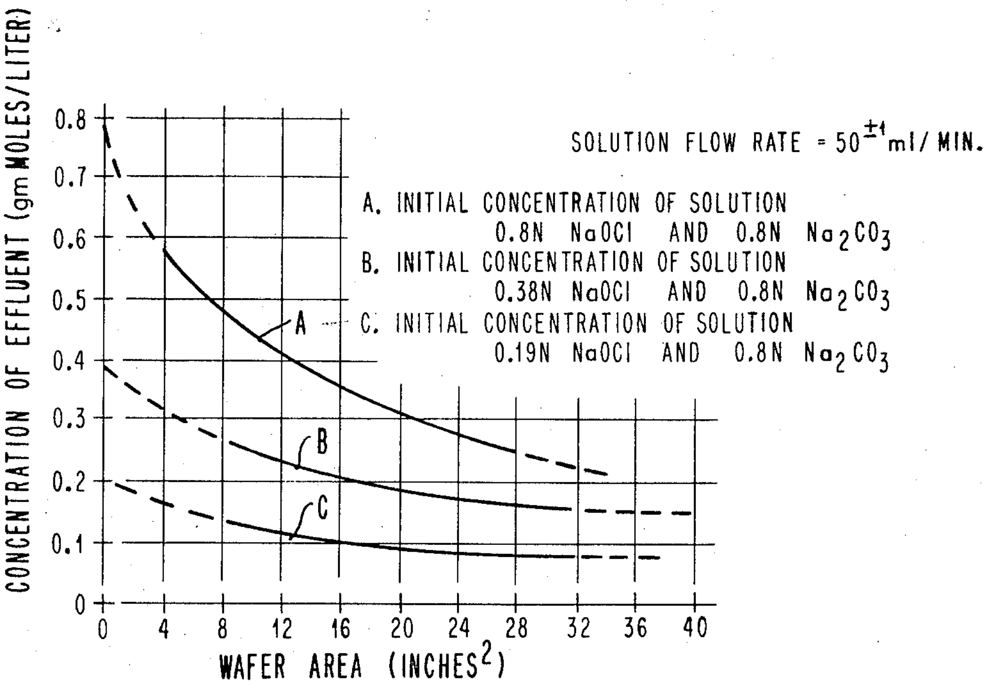
FIG. 2 is a plot of various concentrations of sodium-oxychloride and sodium carbonate solutions while maintaining a constant flow rate of approximately 50 cc. per minute upon the polishing surfaces demonstrating the concentration of the effluent sodium hypochlorite versus the tin doped gallium arsenide area being polished.
Figures 3, 4:
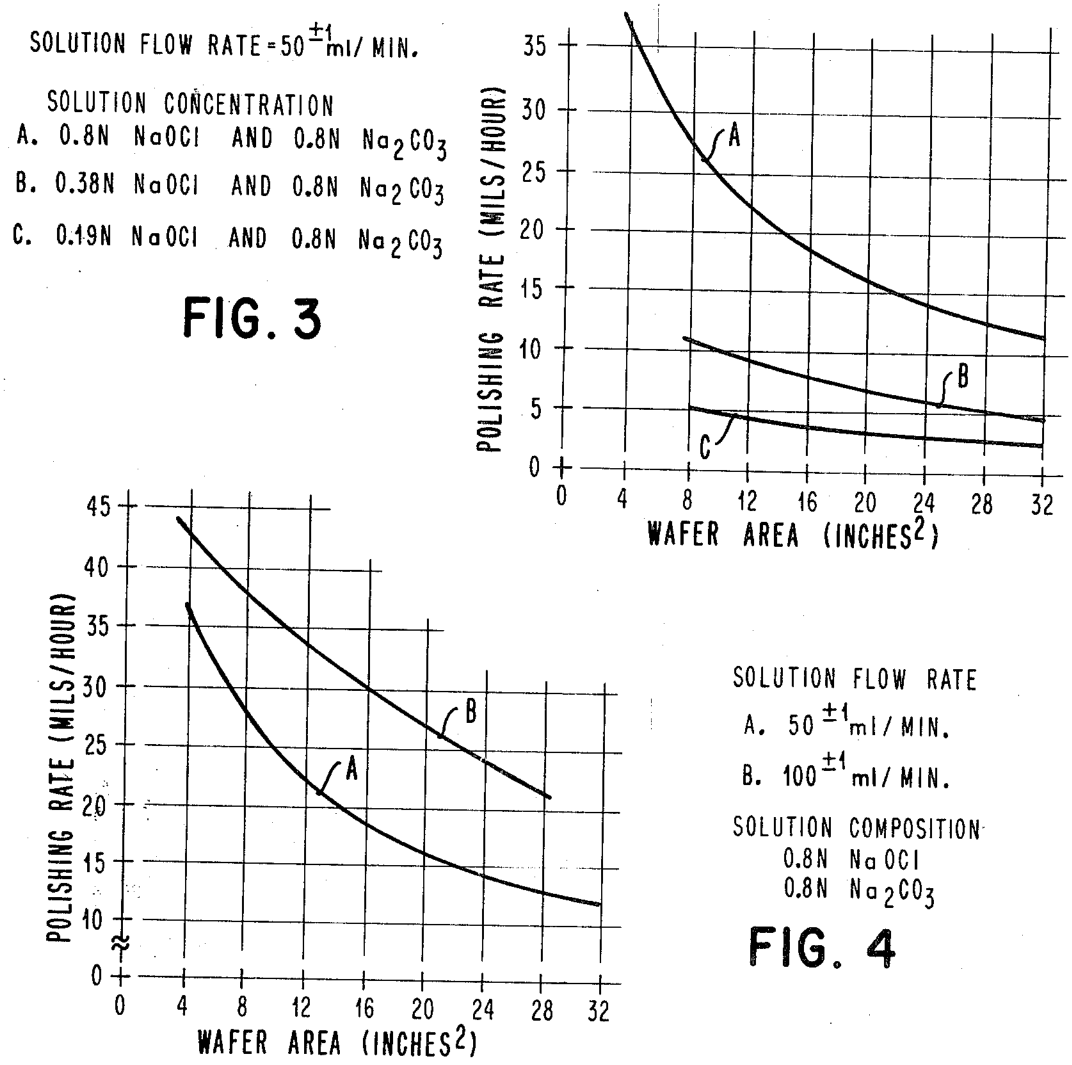
FIG. 3 is a plot of the polishing rate in mils per hour versus the wafer or tin doped gallium arsenide surface area being polished in square inches demonstrating the relationship between area of polished surface and the polishing rate.
FIG. 4 is a plot of the polishing rate in mils per hour versus the area of tin doped gallium arsenide surface being polished at different polishing solution flow rates upon the polishing medium and gallium arsenide surfaces.

The desired polishing rate is controlled by the inter-relationship of sodium or potassium hypochlorite-$Na_2Co_3$ solution flow rate onto the polishing surface, the surface area being polished and the composition of the solutions. These inter-relationships are more specifically illustrated in the drawings. For example, FIG. 1 clearly illustrates the critical nature of alkali carbonates in combination with compatible alkali metal hypochlorites. It is apparent that when the concentration of the alkali metal carbonate is equivalent to the concentration of the hypochlorite, a maximum polishing rate is obtained and increased concentration of the alkali metal carbonate does not affect the polishing rate.

The aforesaid relationship is consistent with the following chemical reactions:

$$GaAs+4NaOCl \rightarrow GaAsO_4+4NaCl$$

$$GaAsO_4+4Na_2CO_3+4H_2O \rightarrow 4NaGa(OH)_4+4NaHCO_3$$

adding the above equations $$GaAs+4NaOCl+4Na_2CO_3+4H_2O \rightarrow 4Na[GaOH_4]+4NaCl+4NaHCO_3$$

Sodium hydroxide will dissolve $GaAsO_4$ but probably due to the high heat of reaction does not produce featureless surfaces when used to polish gallium arsenide.

Commercially available hypochlorite solutions often contain as impurities NaCl and NaOH as well as $NaClO_3$. NaOH as indicated above is detrimental and can be avoided by adding $NaHCO_3$ to the solution which will react with the NaOH to form sodium carbonate.

The following specific example is further illustrative of a specific embodiment of the invention.

Figure 5:
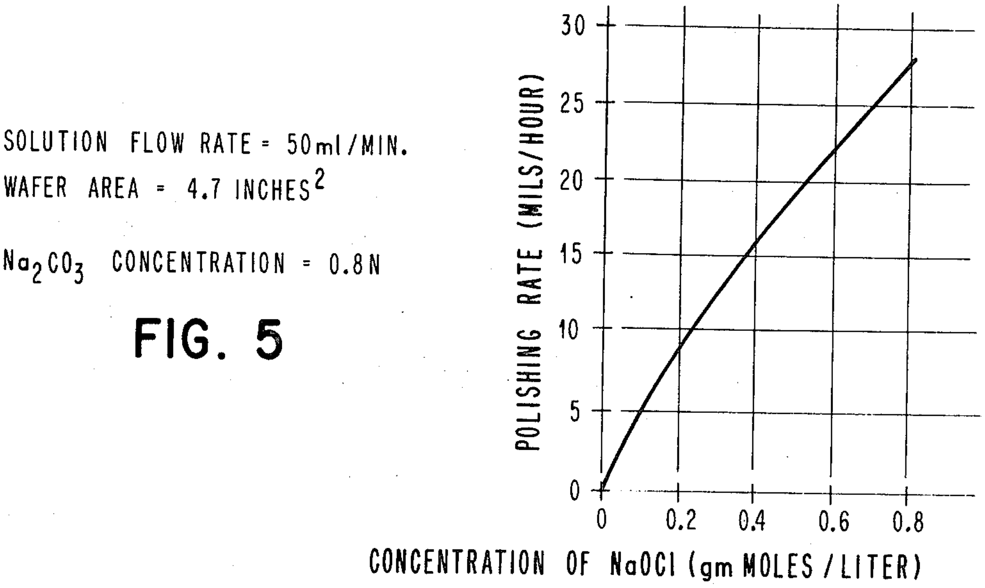
FIG. 5 is a plot of the polishing rate in mils per hour versus sodium hypochlorite concentration in gram mols per litre for chromium doped gallium arsenide illustrating the rate increase relative to concentration increase.

Twelve single crystal gallium arsenide wafers having <100> crystallographic orientation and chromium doped were polished in accordance with this invention using a polishing mechanism as described in the aforesaid patent. The total wafer area was 4.64 sq. in. The wafers were mounted upon a polishing plate which in turn is mounted upon a polishing wheel, rotated said wheel at 60 r.p.m. in accordance with well known standard procedures and washed with water at the rate of approximately 200 cc. per minute for three minutes followed by a constant flow of 50 cc. per minute of polishing solution (0.8 N sodium hypochloride and 0.8 N sodium carbonate). The gallium arsenide wafers were then again water washed on the rotating polishing wheel for three minutes at the rate of approximately 200 cc. per minute. No external pressure was exerted upon the polishing plate. The time of polishing depends upon the rate of material removal as illustrated in FIG. 5, and in this instance was six minutes. The aforesaid procedure produced a bright, shining featureless gallium arsenide surface without any film or other surface contamination.

It has been observed that the more dilute solutions of sodium hypochlorite and sodium carbonate tend to produce a light clear film on the wafer or wafers which is capable of being removed by water washing or washing with a more concentrated solution of sodium hypochlorite and sodium carbonate. Sodium hypochlorite solutions having a normality greater than two are unstable and not practical for use in accordance with this invention. Although washing with water is illustrated, any suitable washing compound which does not react with alkali metal oxychloride is anticipated.

FIG. 5 delineates the relationship between polishing rate and the sodium hypochlorite solution at various concentrations with a constant sodium carbonate concentration and has related to a constant flow rate of 50 cc. per minute upon the polishing medium and the gallium arsenide surface.

The following table sets forth various examples of solution composition at a constant flow rate of 50 cc. per minute and showing the polishing rate for 4.6 sq. in. of chromium doped gallium arsenide surface being polished and illustrating the nature of the polished surface. Chromium doped gallium arsenide generally polishes at a slightly lower rate than tin doped gallium arsenide.

| No. | Concentration (gm. mole/litre) of— NaOCl | $Na_2Co_3$ | Polishing rate (mils/hr.) | Surface condition |
|---|---|---|---|---|
| 1 | 0.8 | 1.6 | 28.2 | Featureless. |
| 2 | 0.8 | 0.8 | 28.2 | Do. |
| 3 | 0.8 | 0.4 | 18.4 | Do. |
| 4 | 0.4 | 0.8 | 16.5 | Do. |
| 5 | 0.4 | 0.4 | 16.3 | Do. |
| 6 | 0.4 | 0.2 | 12.0 | Do. |
| 7 | 0.4 | 0.1 | 10.2 | Do. |
| 8 | 0.2 | 0.8 | 9.0 | Do. |
| 9 | 0.2 | 0.4 | 9.0 | Do. |
| 10 | 0.2 | 0.2 | 9.0 | Do. |
| 11 | 0.2 | 0.1 | 6.7 | Do. |

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for polishing gallium arsenide surfaces comprising mounting said gallium arsenide upon a surface polishing means, providing a constant flow of a solution of an alkali metal hypochlorite selected form the group consisting of sodium and potassium hypochlorites and an alkali metal carbonate containing sufficient bicarbonate to react with any alkali hydroxide which is present in said solution being flowed onto the gallium arsenide while polishing gallium arsenide, washing in situ and removing said gallium arsenide from polishing means.

2. A method in accordance with claim 1 wherein said alkali metal hypochlorite is sodium hypochlorite.

3. A method in accordance with claim 1 wherein said alkali metal hypochlorite is potassium hypochlorite.

4. A method in accordance with claim 1 wherein said washing in situ is accomplished using water.

5. A method in accordance with claim 1 wherein said alkali metal carbonate is sodium carbonate.

6. A method in accordance with claim 1 wherein said alkali metal carbonate is potassium carbonate.

References Cited

UNITED STATES PATENTS

| | | | |
|---|---|---|---|
| 2,690,383 | 9/1954 | Bradshaw | 156—17 |
| 3,342,652 | 9/1967 | Reisman et al. | 156—17 |
| 3,429,756 | 2/1969 | Groves | 156—17 |

OTHER REFERENCES

Shaw: "Enhanced GaAs Etch Rates Near the Edges of a Protective Mask," Jour. Electrochemical Soc., pp. 958, 959, vol. 113, No. 9 (1966).

GEORGE F. LESMES, Primary Examiner

R. J. ROCHE, Assistant Examiner

U.S. Cl. X.R.

252—79.5